United States Patent

[11] 3,579,059

[72] Inventor Robert J. Widlar
Mountain View, Calif.
[21] Appl. No. 712,040
[22] Filed Mar. 11, 1968
[45] Patented May 18, 1971
[73] Assignee National Semiconductor Corporation
Santa Clara, Calif.

[54] MULTIPLE COLLECTOR LATERAL TRANSISTOR DEVICE
5 Claims, 6 Drawing Figs.

[52] U.S. Cl. .......... 317/235, 307/299
[51] Int. Cl. .......... H01l 11/00
[50] Field of Search .......... 317/235/40.12, 235/40.13; 317/235, 235/22, 235/40.1, 235/27; 307/299

[56] References Cited
UNITED STATES PATENTS

| | | | |
|---|---|---|---|
| 2,827,599 | 3/1958 | Jochems | 317/235 |
| 3,197,710 | 7/1965 | Lin | 317/235X |
| 3,389,230 | 6/1968 | Hudson | 317/235X |
| 2,666,150 | 1/1954 | Blakely | 307/299 |
| 2,882,463 | 4/1959 | Dickinson | 307/299 |

*Primary Examiner*—Jerry D. Craig
*Attorney*—Harvey G. Lowhurst

ABSTRACT: A lateral transistor device constructed to have a single emitter region and a single base region operatively associated with a plurality of collector regions. Each of the various collector regions forms a separate PN junction with the base region which is dimensioned and disposed with respect to the base-emitter junction to provide a predetermined portion of the total available collector current.

INVENTOR
ROBERT J. WIDLAR
BY [signature]
ATTORNEY

MULTIPLE COLLECTOR LATERAL TRANSISTOR DEVICE

BACKGROUND OF THE INVENTION

1. Field of the Invention

This invention relates to semiconductor devices which may either be discrete or form part of an integrated structure, and, more particularly, to a lateral transistor device which has a plurality of collector regions forming separate PN junctions with the base region which, in turn, forms a single PN junction with the emitter region.

This invention also relates to a device which provides a plurality of current signals, such as are usually only available from a plurality of isolated current sources, which remain proportional to one another in accordance with some selected proportion and variable in amplitude in accordance with a single input signal.

2. Description of the Prior Art

There are, at times, requirements in circuits which can be met by providing either a voltage source with a series resistor or a current source. For example, when utilizing a Zener diode as a voltage regulator, one side of the diode may be connected either to a voltage source through a biasing resistor or directly to a current source. In ordinary circuits, the cost of a current source usually is much greater than that of a biasing resistor so that resistors are commonly used. This is true even though a current source would make the regulator more independent of the unregulated voltage.

When such requirements are encountered in connection with integrated circuits, the cost of a current source and a resistor are not as disproportionate. In fact, in cases of large resistors, the difficulty encountered in their manufacture and the required surface area make current sources often more economical and convenient. Such current sources usually take the form of a transistor with the associated biasing circuitry.

When the integrated circuit is very complex, as is often the case, there may be a requirement for a plurality of current sources. Heretofore, such a plurality was supplied by using a separate transistor and its biasing circuitry for each. The utilization of different current sources is wasteful in that it adds to the manufacturing cost, and requires valuable surface area which could be put to other uses.

It is, therefore a primary object of the present invention to provide a transistor device which is capable of supplying a plurality of output currents which are and remain proportional to one another and to a transistor input signal, and which occupy no more surface area than a conventional transistor device.

It is still a further object of the present invention to provide a single transistor device having a plurality of collector current output circuits which are isolated from one another. It is a further object of this invention to provide a plurality of isolated current sources which are controllable with a single input signal.

It is another object of the present invention to provide a new type of semiconductor device, of the lateral transistor type, having a plurality of isolated output circuits for providing output currents and a single input circuit subject to an input signal which controls the output currents.

It is still another object of the present invention to provide an inexpensive and reliable semiconductor device which has a plurality of isolated output circuits which are controlled by a common input circuit and which may, therefore, be connected to form a current source for supplying multiple current signals.

SUMMARY OF THE INVENTION

In accordance with the present invention, there is provided a lateral transistor device, either of the PNP or the NPN type, having an emitter region diffused into a suitable base region and forming a single PN junction therewith. This PN junction is conventionally forward biased to inject minority current carriers into the base region. Further, the transistor device has a plurality of individual and separate collector regions diffused into the base regions to form a plurality of separate PN junctions with the base region. These last-mentioned junctions are separately and individually reverse biased to collect the carriers injected by the emitter region. The junction between each collector region and the base region, in combination with the junction between the emitter region and the base region, provides transistor operation and the sum of the individual collector currents is equal to the emitter current less the base current.

Further objects and advantages of the present invention will become apparent to those skilled in the art to which the invention pertains as the ensuing description proceeds.

The features of novelty that are considered characteristic of this invention are set forth with particularity in the appended claims. The organization and method of operation of the invention itself will best be understood from the following description when read in connection with the accompanying drawings in which:

DESCRIPTION OF THE PREFERRED EMBODIMENT

Figure 1:
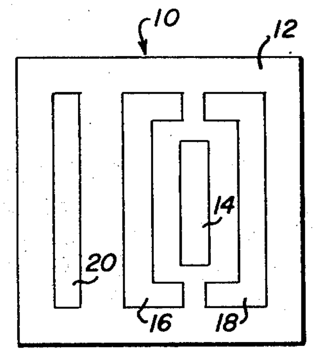
FIG. 1 is a plane view of a semiconductor device constructed in accordance with the present invention.

Referring now to FIG. 1, there is illustrated a transistor device 10 constructed in accordance with the present invention. Transistor device 10 comprises a block of semiconductive material, of either N-type or P-type conductivity, which forms the base region. Diffused into the upper surface 12 of block 10 is an emitter region 14 and a pair of separate collector regions 16 and 18 of a semiconductive material having a conductivity opposite to that of the conductivity of block 12. Finally, there is provided a relatively heavily doped region 20, which has the same conductivity as the base region, to which an electrical lead to carry the base current may be connected.

The device illustrated in FIG. 1 is basically a transistor having two separate collectors, each of which is essentially independent of the other. The effective junction between each collector region and the base region is the portion most closely spaced to the emitter-base junction, and the collector current provided by each collector region is proportional to the effective junction and particularly the minority current carrier flowing thereacross when suitably back-biased. As long as collector regions 16 and 18 are of equal size and symmetrically spaced with respect to emitter region 14, the total collector current divides itself equally between them providing the potential drop across the effective junctions are equal. The sum of the collector currents is, of course, equal to the emitter current minus the base current.

Figure 2:
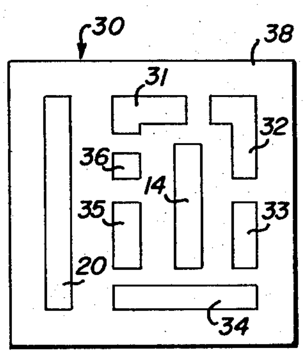
FIG. 2 is a plane view of another embodiment of a semiconductor device constructed in accordance with the present invention.

Referring now to FIG. 2, there is shown a transistor device 30, constructed in accordance with the present invention, having six collector regions indicated as 31, 32, 33, 34, 35 and 36. As before, device 30 comprises a block of semiconductive material of either N-type or P-type conductivity which forms the base region. Diffused into the upper layer 38 of block 30 is an emitter region 14 and the six separate collector regions 31—36 of a semiconductive material having a conductivity opposite to the conductivity of surface layer 38. There is also provided a relatively heavily doped region 20 of the same kind of conductivity as the base region, to which an electrical lead to carry the base current may be connected.

The device illustrated in FIG. 2 is basically a transistor having six separate collectors, each of which is independent of the other. By selecting the various collector regions of different size, or having a different effective junction length opposite the emitter-base region junction, different amounts of collector currents are provided, the current being a function of minority current carriers flowing to each collector region.

Transistor devices 10 and 30 can be constructed in accordance with the well-known methods used in the construction of lateral transistors, the primary difference being that the collector region is formed to have separate portions, each portion forming a separate junction.

Figure 3:
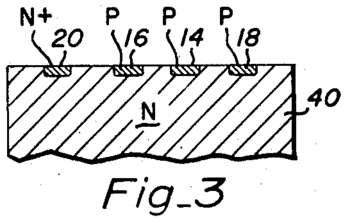
FIGS. 3 and 4 are schematic side views, in cross-sectional form, of semiconductor devices constructed in accordance with the present invention.

FIG. 3 schematically illustrates a cross-sectional view of a transistor structure of the type shown in FIGS. 1 (or 2) in which there is provided a suitable base region material 40 of P-type semiconductivity having a planar upper surface of sufficient extent to accommodate the emitter and collector regions. The lower portion of block 40 is broken off to indicate a continuation of N-type material.

Regions 14, 16, 18 and 20 are formed on base region 40 in a conventional manner. An oxide diffusion mask is formed on the upper surface of the base region material from which certain portions are selectively removed by photoresist masking and etching techniques to expose such portions to further processing. N+ region 20 is relatively heavily doped with donors to a concentration which is typically in excess of $10^{19}$ atoms per cubic centimeter. Emitter region 14 and collector regions 16 and 18 are typically doped at the same time with acceptors to a concentration typically between about $5\times10^{17}$ to $5\times10^{18}$ atoms per cubic centimeters. The device illustrated in FIG. 3 is a PNP multiple collector transistor device.

Figure 4:
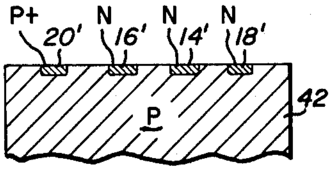

Referring now to FIG. 4, there is shown a device similar to that illustrated in FIG. 3 except that the same is an NPN multiple collector transistor device. As before, a suitable base region material 42 of N-type semiconductivity is provided which has a planar upper surface of sufficient extent to accommodate the emitter region 14', collector regions 16' and 18' and the P+ contact region 20' formed thereon by diffusion techniques. As before, the lower portion of block 42 is broken off to indicate that it may be a part of a P-type substrate, or a part of an epitaxial layer grown upon an N-type substrate as in an integrated circuit.

Figure 5:
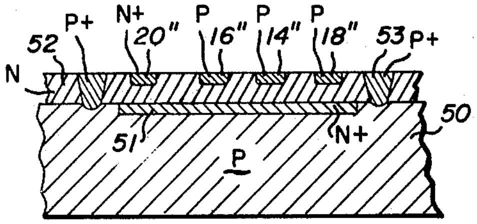
FIG. 5 is a side view, in cross-sectional form, of the semiconductor device of the present invention incorporated in an integrated circuit.

Referring now to FIG. 5, there is shown a cross-sectional view of a multiple collector PNP transistor device formed as part of an integrated circuit. There is provided a starting material in the form of a monocrystalline body of P-type semiconductive material formed by crystal growing techniques which forms a substrate 50. Diffused into substrate 50 is an N+ isolation region 51 with relatively heavy doping. Thereafter, a surface layer 52 is formed upon the upper surface of substrate 50 by epitaxial growth, layer 52 being a monocrystalline extension, of N-type conductivity, of substrate 50. Thereafter, P-type emitter region 14'', P-type collector regions 16'' and 18'', N+ base contact region 20'', and a P+ isolation region 53 are formed by diffusion techniques. Isolation region 53 completely encircles the emitter, collector and contact regions, and penetrates through epitaxial layer 52 into substrate 50 for complete isolation of the entire lateral transistor structure.

Figure 6:
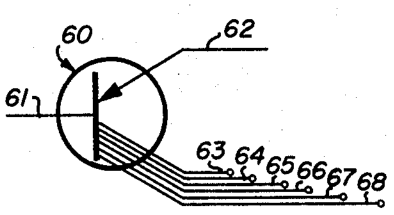
FIG. 6 is a symbolic representation of the semiconductor device of this invention.

Referring now to FIG. 6, there is shown a symbolic representation 60 of transistor device 30 of FIG. 2. Transistor device 60 typically has a base lead 61 which is connected to base contact region 20 of FIG. 2, an emitter lead 62 which is connected to emitter region 14, and six collector leads 63, 64, 65, 66, 67 and 68 which are respectively connected to collector regions 31, 32, 33, 34, 35 and 36.

There has been described hereinabove a multiple collector lateral transistor device which provides multiple collector currents which are independent of one another and which may be varied by a common input signal. The collector regions may be sized to provide the desired amount of collector current, the desired amount being a fixed proportion of the total collector current.

While the above detailed description has shown, described and pointed out the fundamental novel features of the invention as applied to various embodiments, it will be understood that various omissions and substitutions and changes in the form and details of the device illustrated may be made by those skilled in the art, without departing from the spirit of the invention. It is the intention, therefore, to be limited only as indicated by the scope of the following claims.

I claim:

1. A lateral transistor device for providing at least two proportional collector currents the magnitudes of which are simultaneously controllable by a single base input current comprising:

a body of semiconductive material of a first conductivity type forming the base region of said lateral transistor device;

a single emitter region of a second conductivity type formed beneath one area of one surface of said body of semiconductive material forming an emitter-base junction; and at least two collector regions of said second conductivity type formed beneath different areas of said one surface of said body of semiconductive material, said different areas being spacially disposed relative to said one area, said collector regions having different effective junction lengths opposite said emitter-base junction such that that currents caused to flow from said emitter region and through the respective ones of said collector regions are at all times proportional to the relative effective junction length of said collector region.

2. A lateral transistor device as recited in claim 1 wherein said collector regions are disposed about said single emitter region at predetermined distances from the nearest emitter-base junction, and said collector regions are spacially separated from each other.

3. A lateral transistor device as recited in claim 2 wherein said collector regions lie in a segmented beltlike region which circumscribes said emitter region.

4. In a lateral transistor structure of the type having a base region of a first conductivity type and discrete emitter and collector regions of a second conductivity type formed in said base region and spacially separated from each other, the improvement comprising:

collector means including a plurality of individual and discrete collector regions of said second conductivity type disposed in spaced apart relationship about a single emitter region of said second conductivity type, said collector regions having different effective junction length opposing said emitter region so as to provide collector currents which are directly proportional to the relative effective junction lengths of the respective collector regions.

5. A lateral transistor device for use in dividing an electrical current into a plurality of proportional electrical currents comprising:

a body of semiconductive material of a first conductivity type forming a base region to which a first electrical terminal is connected;

a single discrete emitter region of a second conductivity type formed in said base region and having a second electrical terminal connected thereto through which said electrical current may be caused to pass; and a plurality of discrete collector regions of said second conductivity type formed in said base region along a path spaced from but circumscribing said emitter region, said collector region having different effective lengths opposing said emitter region, a plurality of electrical output terminals respectively connected to said collector regions such that the output currents obtainable at the respective output terminals are proportionally related to the portion of the circumscribing path which each collector region occupies.